United States Patent [19]
Ziemkowski et al.

[11] Patent Number: 6,046,605
[45] Date of Patent: Apr. 4, 2000

[54] BIDIRECTIONAL ASYNCHRONOUS OPEN COLLECTOR BUFFER

[75] Inventors: Ted B. Ziemkowski; Gregory A. Hill; Daniel E. Yee, all of Loveland, Colo.

[73] Assignee: Hewlett-Packard Company, Palo Alto, Calif.

[21] Appl. No.: 08/934,279

[22] Filed: Sep. 19, 1997

[51] Int. Cl.[7] .............................................. H03K 19/0175
[52] U.S. Cl. .................................................. 326/86; 326/90
[58] Field of Search ..................... 326/82, 86, 90, 326/21, 30

[56] References Cited

U.S. PATENT DOCUMENTS

| | | | |
|---|---|---|---|
| 5,214,330 | 5/1993 | Okazaki | 307/443 |
| 5,585,742 | 12/1996 | Kamiya | 326/56 |
| 5,714,892 | 2/1998 | Bowers et al. | 326/60 |
| 5,877,633 | 3/1999 | Ng et al. | 326/80 |

*Primary Examiner*—Michael Tokar
*Assistant Examiner*—Peguy JeanPierre

[57] ABSTRACT

A bidirectional asynchronous open collector buffer. The buffer employs set delays and control logic to prevent latch up of the buffer when the low signal is applied to one of the ports of the buffer. Additionally, the buffer employs reset delays in conjunction with the control logic for suppressing oscillation of the buffer when one of the ports of the buffer is released from the applied low signal.

7 Claims, 6 Drawing Sheets

BIDIRECTIONAL ASYNCHRONOUS OPEN COLLECTOR BUFFER

The present invention is generally directed to buffer circuits for electronic signals, and is more particularly directed to a bidirectional asynchronous open collector buffer for bus extension.

Various asynchronous open collector drivers are employed to drive signals in system backplane busses of the prior art. An open collector driver is a type that only drives a signal to either a low state or not at all. Pull up resistors coupled thereto pull a high state when not driven to the low state by the open collector driver. An asynchronous driver is adapted for transmitting the signal without an accompanying clocking or latching signal. For example in a VXI (Versamodule european eXtensions for Instrumentation) system backplane bus, an asynchronous open collector driver is employed to drive the SYSRESET* signal.

System capabilities are expanded through extension of the system backplane bus. In such extension of the system backplane bus, bidirectional current drive buffering is needed to avoid degradation of bidirectional signals. For example, specifications for the VXI system backplane bus recommend against extending a length of conductor beyond the backplane by more than two inches without termination of buffering.

What is needed is a bidirectional asynchronous open collector buffer.

SUMMARY OF THE INVENTION

The present invention provides a bidirectional asynchronous open collector buffer. The invention advantageously provides bidirectional current drive buffering, so as to avoid degradation of bidirectional signals transmitted through system bus extension conductors that are substantially greater than approximately two inches long. For example in a VXI (Versamodule european eXtensions for Instrumentation) system backplane bus, the buffer of the invention is advantageously employed to drive the SYSRESET* signal.

Since the invention is an open collector buffer, it only drives the signal to either a low state or not at all. It should be understood that asynchronous drivers transmit signals without any accompanying clocking or latching signals. Accordingly, since the invention is an asynchronous buffer, it is adapted for transmitting the signal without an accompanying clocking or latching signal. Therefore, the invention provides advantageous compatibility with asynchronous open collector drivers of the system bus being extended.

Briefly, and in general terms, the buffer of the invention includes a first open collector driver having an input coupled with a first signal port of the buffer, and having an output coupled with a second signal port of the buffer for driving the second port when a low signal is applied to the first port. Similarly, a second open collector driver has an input coupled with the second port, and has an output coupled with the first port for driving the first port when a low signal is applied to the second port.

The buffer advantageously employs set delays and control logic to prevent latch up of the buffer when the low signal is applied to one of the ports of the buffer. For example, a first set delay element is coupled with the output of the first open collector driver, and a first logic controller has an output coupled to the input of the second open collector driver and further has inputs coupled with the input of the first open collector driver and with the first set delay element, so as to prevent latch up of the buffer when the low signal is applied to the first port of the buffer.

The buffer advantageously employs reset delays in conjunction with the control logic for suppressing oscillation of the buffer when one of the ports of the buffer is released from the applied low signal. For example, a first reset delay element is coupled with the input of the first open collector drive, and the first logic controller has another input coupled with the first reset delay element for suppressing oscillation of the buffer when the first port of the buffer is released from the applied low signal.

Other aspects and advantages of the present invention will become apparent from the following detailed description, taken in conjunction with the accompanying drawings, illustrating by way of example the principles of the invention.

DETAILED DESCRIPTION OF PREFERRED EMBODIMENT

Figure 1:
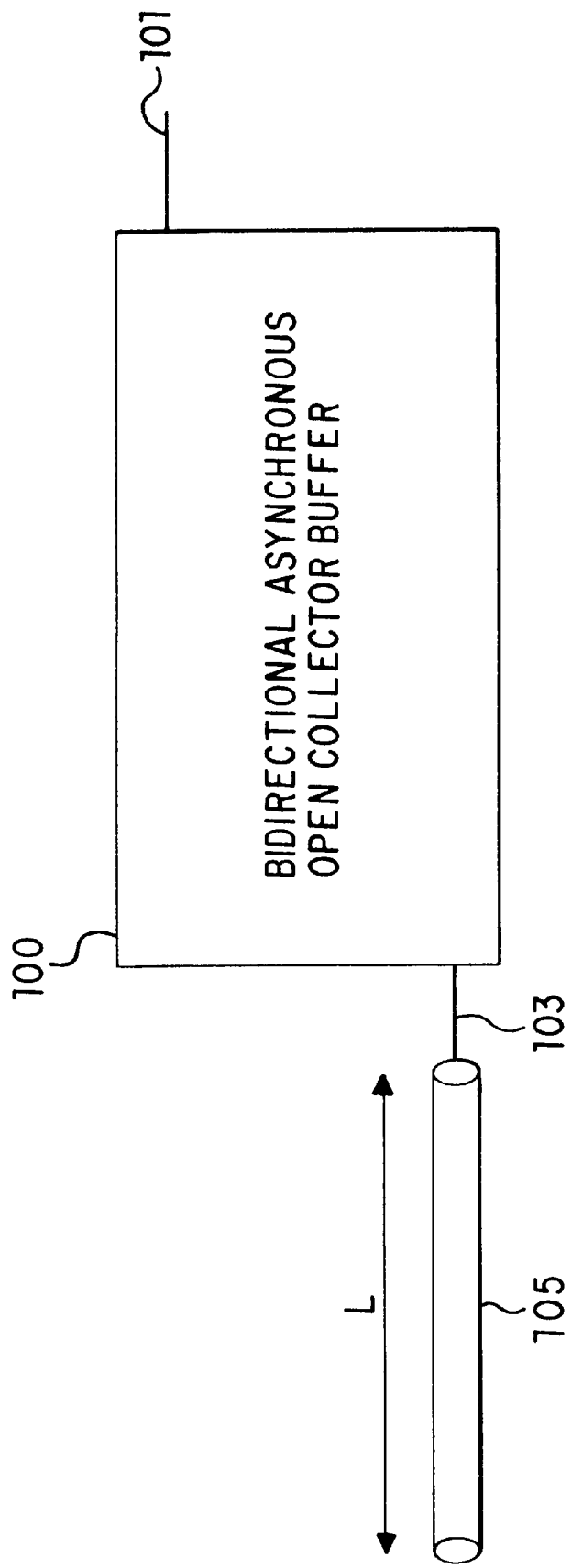
FIG. 1 is a simplified block diagram showing a bidirectional asynchronous open collector buffer of the invention.

FIG. 1 is a simplified block diagram showing a bidirectional asynchronous open collector buffer 100 of the invention having a pair of signal ports 101, 103. The invention advantageously provides bidirectional current drive buffering, so as to avoid degradation of bidirectional signals transmitted through system bus extension conductors 105 that have a length, L, substantially greater than approximately two inches long.

Figure 2:
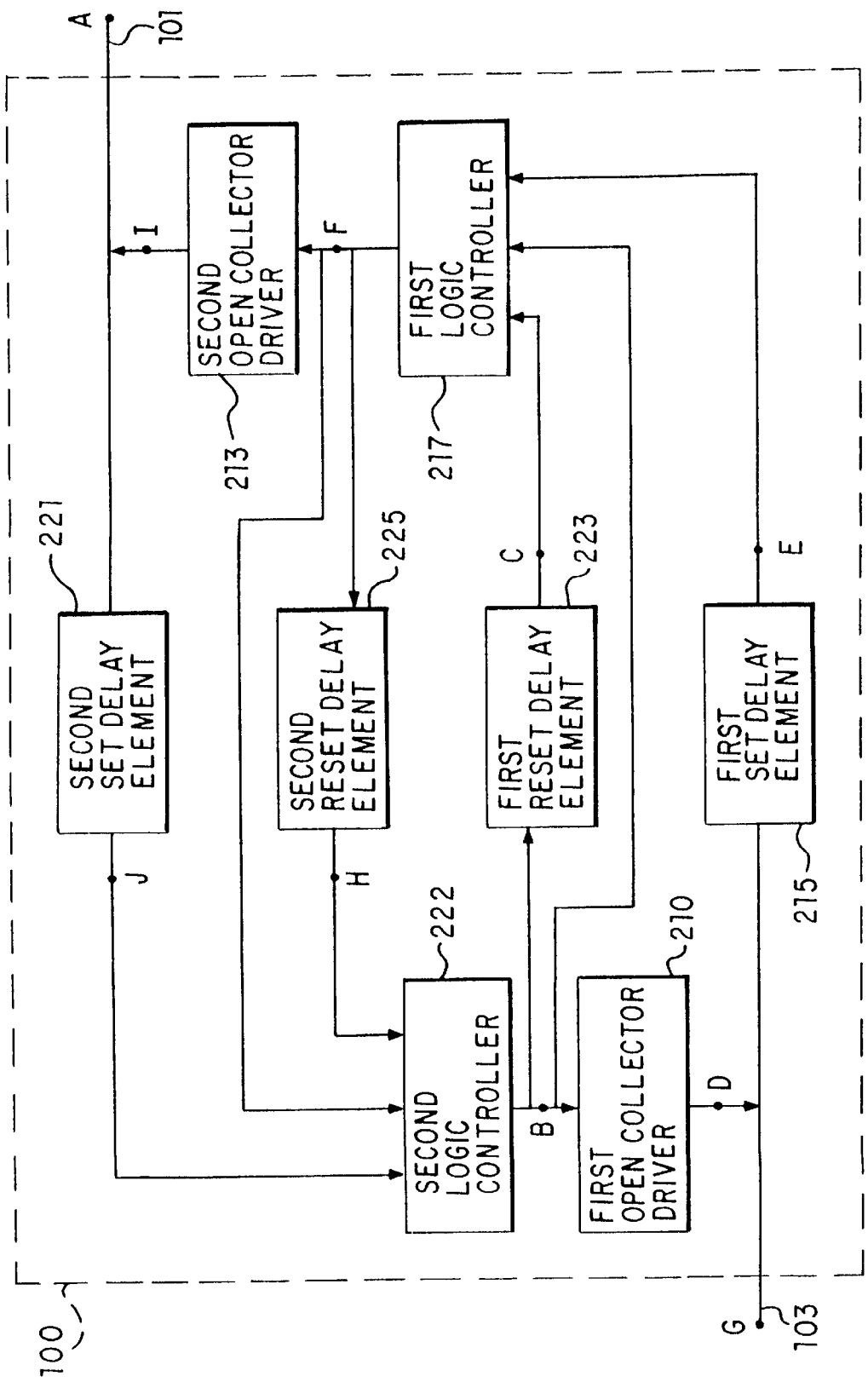
FIG. 2 is a detailed block diagram illustrating the bidirectional asynchronous open collector buffer of the invention.

FIG. 2 is a detailed block diagram illustrating the bidirectional asynchronous open collector buffer 100 of the invention. As shown, the buffer of the invention includes a first open collector driver 210 having an input coupled with a first signal port 101 of the buffer, and having an output coupled with a second port 103 of the buffer for driving the second port when a low signal is applied to the first port 101. Similarly, a second open collector driver 213 has an input coupled with the second port 103, and has an output coupled with the first port 101 for driving the first port when a low signal is applied to the second port 103.

As shown in FIG. 2, a first set delay element 215 is coupled with the output of the first open collector driver, and a first logic controller 217 has an output coupled to the input of the second open collector driver and further has inputs coupled with the input of the first open collector driver and with the first set delay element, so as to prevent latch up of the buffer when the low signal is applied to the first port 101 of the buffer.

A similar arrangement prevents latch up of the buffer when the low signal is applied to the second port 103 of the buffer. Specifically, a second set delay element 221 is coupled with the output of the second open collector driver, and a second logic controller 222 has an output coupled to the input of the first open collector driver and further has inputs coupled with the input of the second open collector driver and with the second set delay element, so as to prevent latch up of the buffer when the low signal is applied to the second port 103 of the buffer.

As shown in FIG. 2, a first reset delay element is coupled with the input of the first open collector drive, and the first logic controller has another input coupled with the first reset delay element 223 for suppressing oscillation of the buffer when the first port 101 of the buffer is released from the applied low signal. A similar arrangement suppresses oscillation of the buffer when the second port 103 of the buffer is released from the applied low signal. Specifically, a second reset delay element 225 is coupled with the input of the second open collector drive, and the second logic controller has another input coupled with the second reset delay element for suppressing oscillation of the buffer when the second port 103 is released from the applied low signal.

Figure 3:
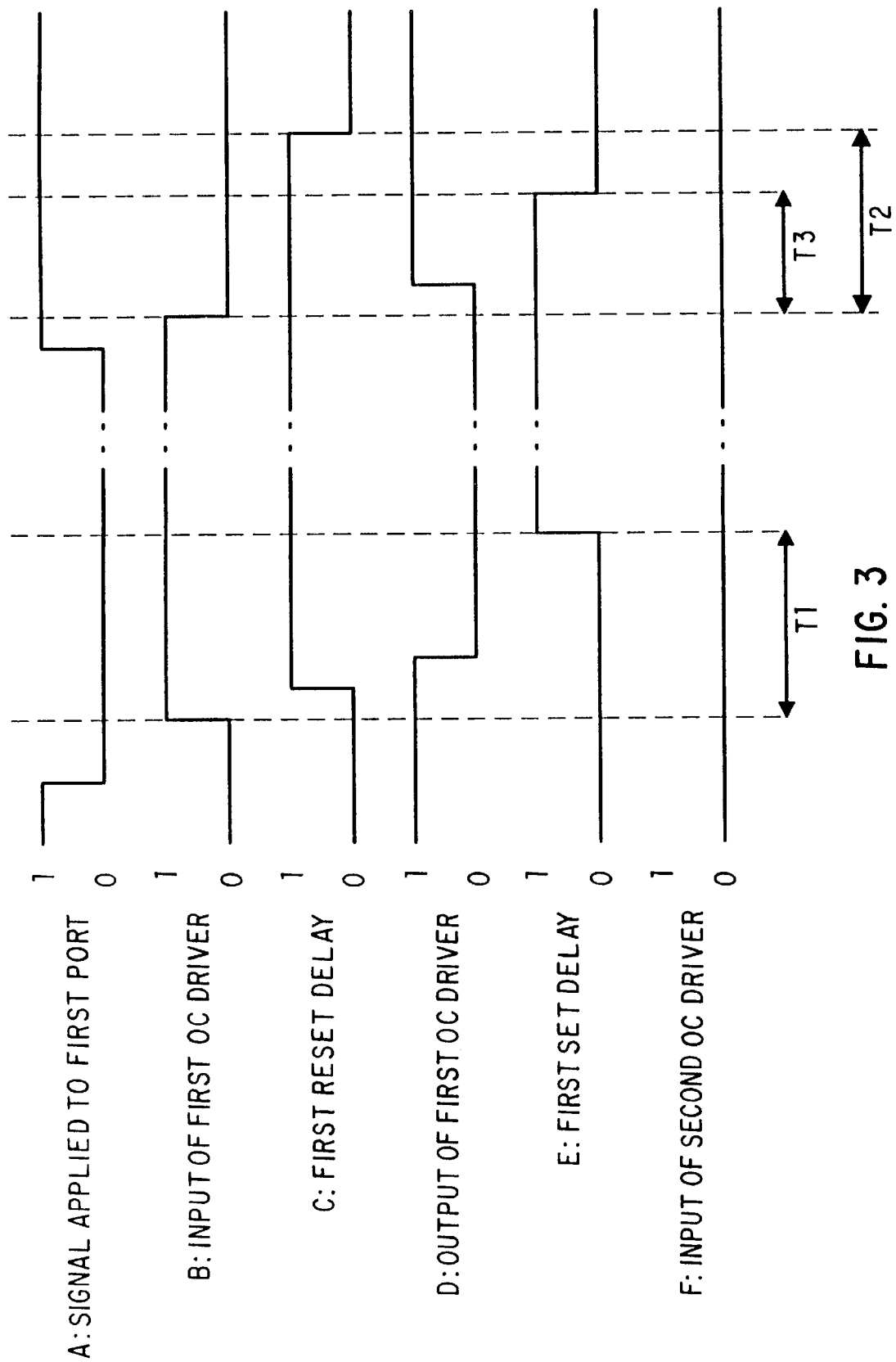
FIG. 3 is a logic timing diagram illustrating operation of the buffer of the invention when a low signal is applied to a first port of the buffer.
Figure 4:
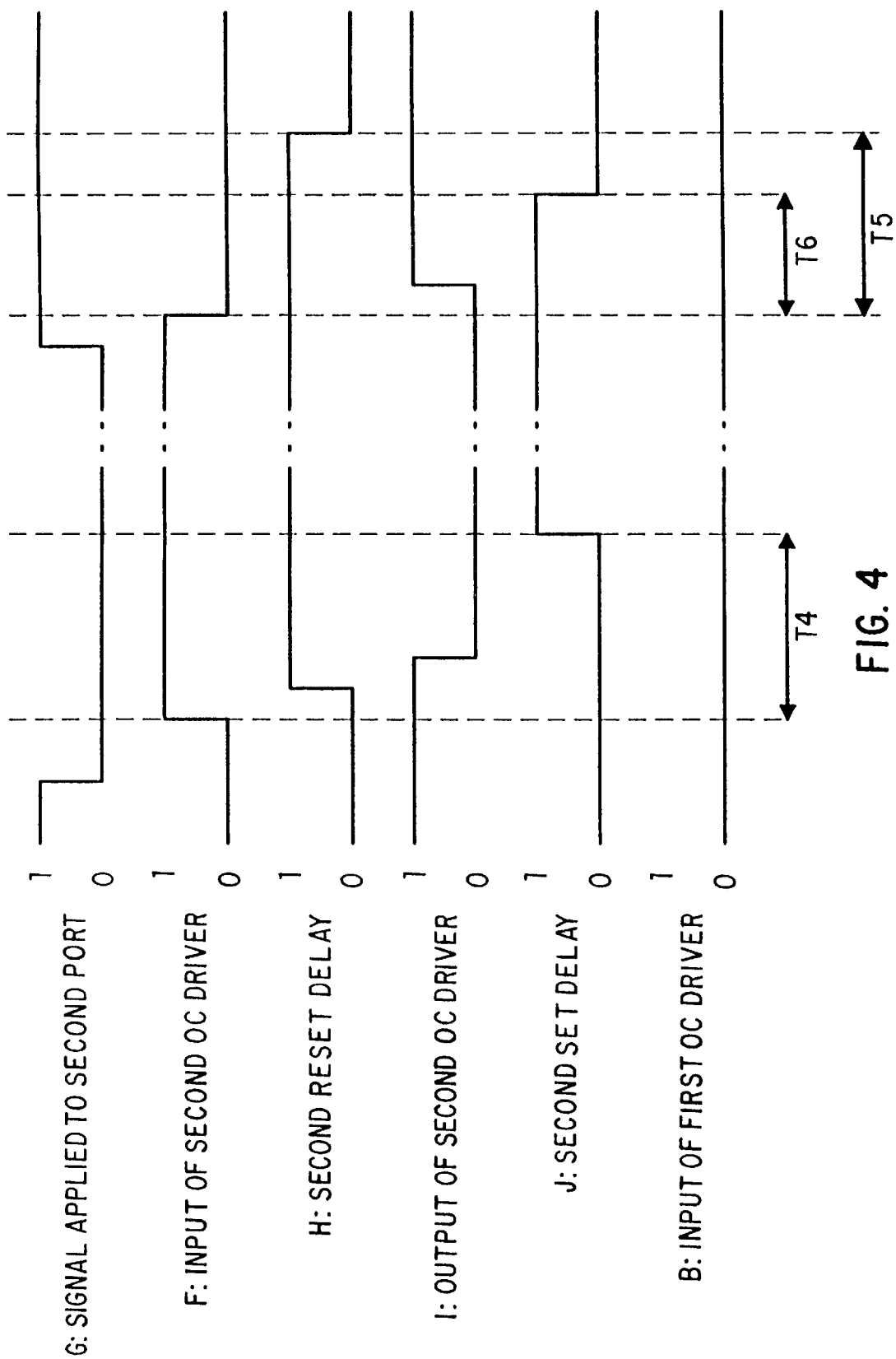
FIG. 4 is a logic timing diagram illustrating operation of the buffer of the invention when the low signal is applied to a second port of the buffer.

For purposes of illustrating operation of the buffer, in FIG. 1 letters A through J are assigned to various points in the detailed block diagram, in correspondence with traces in logic timing diagrams in FIGS. 3 and 4.

FIG. 3 is a logic timing diagram illustrating operation of the buffer when the low signal is applied to the first port 101 of the buffer. As shown in FIG. 3, for the trace corresponding to point A, the signal applied to the first port is set low, and later is reset (released). This signal in turn propagates though the buffer to the output of the first open collector driver shown in the trace corresponding to point D. As shown, the output of the first open collector driver drives the second signal port of the buffer in response to the signal applied to the first signal port of the buffer.

As shown in FIG. 3, for the trace corresponding to point E, the first set delay element provides a delayed inverted version of the output of the first open collector driver to the input of the first logic controller. However, before this delayed inverted version reaches the first logic controller, the input of the first open collector driver shown In the trace corresponding to point B is also applied to the first logic controller. The first logic controller responds by maintaining the state of the input of the second open collector driver, as illustrated by the trace corresponding to point F, thereby preventing latch up of the buffer when the low signal is applied to the first port of the buffer. To avoid latch up for preferred Transistor Transistor Logic (TTL) embodiments, a time interval, T1, between the rising edge of the input of the first open collector driver and the rising edge of the first set delay should be greater than approximately ten nanoseconds, but substantially less than a target propagation delay of the buffer.

As shown in FIG. 3, for the trace corresponding to point C, the first reset delay element provides a delayed version of the input of the first open collector driver to the input of the first logic controller. However, before this delayed version reaches the first logic controller, the first set delay shown In the trace corresponding to point E is also applied to the first logic controller. The first logic controller responds by maintaining the state of the input of the second open collector driver, as illustrated by the trace corresponding to point F, thereby suppressing oscillation of the buffer when the first port of the buffer is released from the applied low signal. A time interval, T2, between the falling edge of the input of the first open collector driver and the falling edge of the first reset delay is shown in FIG. 3. Another time interval, T3, between the falling edge of the input of the first open collector driver and the falling edge of the first set delay is shown in FIG. 3. To avoid oscillation for preferred Transistor Transistor Logic (TTL) embodiments, the time interval T3 plus approximately ten nanoseconds should be less than the time interval T2, which in turn should be substantially less than a target propagation delay of the buffer.

Similarly, FIG. 4 is a logic timing diagram illustrating operation of the buffer when the low signal is applied to the second port 103 of the buffer. As shown in FIG. 4, for the trace corresponding to point G, the signal applied to the second port is set low, and later is reset (released). This signal in turn propagates though the buffer to the output of the second open collector driver shown in the trace corresponding to point 1. As shown, the output of the second open collector driver drives the first signal port of the buffer in response to the signal applied to the second signal port of the buffer.

As shown in FIG. 4, for the trace corresponding to point J, the second set delay element provides a delayed inverted version of the output of the second open collector driver to the input of the second logic controller. However, before this delayed inverted version reaches the second logic controller, the input of the second open collector driver shown In the trace corresponding to point F is also applied to the second logic controller. The second logic controller responds by maintaining the state of the input of the first open collector driver, as illustrated by the trace corresponding to point B, thereby preventing latch up of the buffer when the low signal is applied to the second port of the buffer. To avoid latch up for preferred Transistor Transistor Logic (TTL) embodiments, a time interval, T4, between the rising edge of the input of the second open collector driver and the rising edge of the second set delay should be greater than approximately ten nanoseconds, but substantially less than a target propagation delay of the buffer.

As shown in FIG. 4, for the trace corresponding to point H, the second reset delay element provides a delayed version of the input of the second open collector driver to the input of the second logic controller. However, before this delayed version reaches the second logic controller, the second set delay shown In the trace corresponding to point J is also applied to the second logic controller. The second logic controller responds by maintaining the state of the input of the first open collector driver, as illustrated by the trace corresponding to point B, thereby suppressing oscillation of the buffer when the second port of the buffer is released from the applied low signal. A time interval, T5, between the falling edge of the input of the second open collector driver and the falling edge of the second reset delay is shown in FIG. 4. Another time interval, T6, between the falling edge of the input of the second open collector driver and the falling edge of the second set delay is shown in FIG. 4. To avoid oscillation for preferred Transistor Transistor Logic (TTL) embodiments, the time interval T6 plus approximately ten nanoseconds should be less than the time interval T5, which in turn should be substantially less than the target propagation delay of the buffer.

Figure 5:
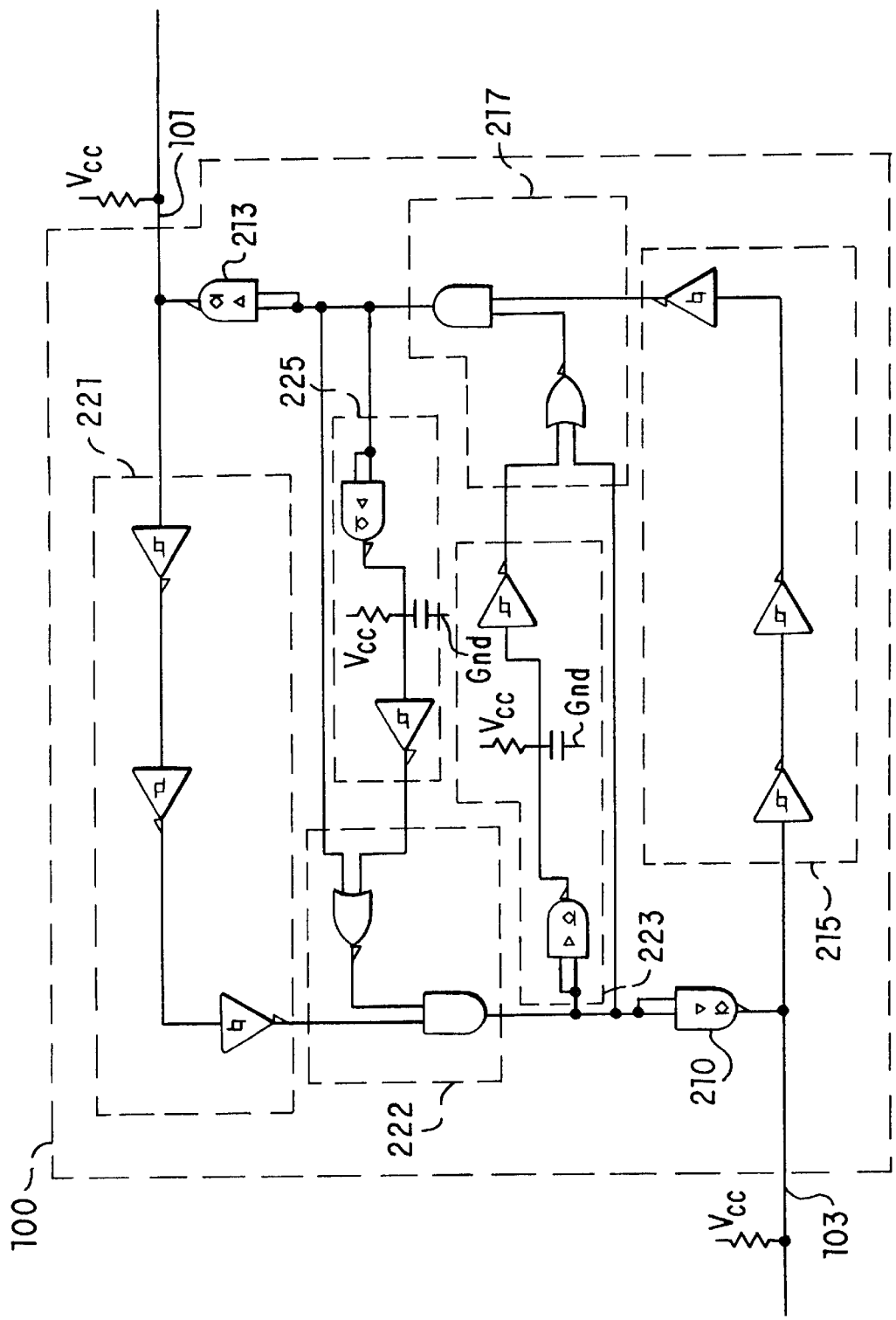
FIG. 5 is a circuit diagram of a preferred embodiment of the bidirectional asynchronous open collector buffer of the invention.

FIG. 5 is a circuit diagram of a preferred embodiment of the bidirectional asynchronous open collector buffer 100 of the invention, having the first signal port 101 and the second signal port 103. In the preferred embodiment, the functional blocks of the first open collector driver 210 and the second open collector driver 213 are each implemented in circuitry as a respective 74F38 NAND gate having both inputs connected together as shown in FIG. 5. The functional blocks of the first set delay element 215 and the second set delay element 221 are each implemented in circuitry as a respective three 74ACT14 inverters. The functional blocks of the first logic controller 217 and the second logic controller 222 are each implemented in circuitry as a respective 74ACT02 NOR gate coupled with a respective 74ACT08 AND gate as shown in FIG. 5. The functional blocks of the first reset delay element 223 and the second reset delay element 225 are each implemented in circuitry as a respective 74F38 NAND gate coupled with a respective twelve point one KiloOhm resistor, a respective one hundred PicoFarad capacitor, and a respective 74ACT14 inverter, as shown in FIG. 5.

Figure 6:
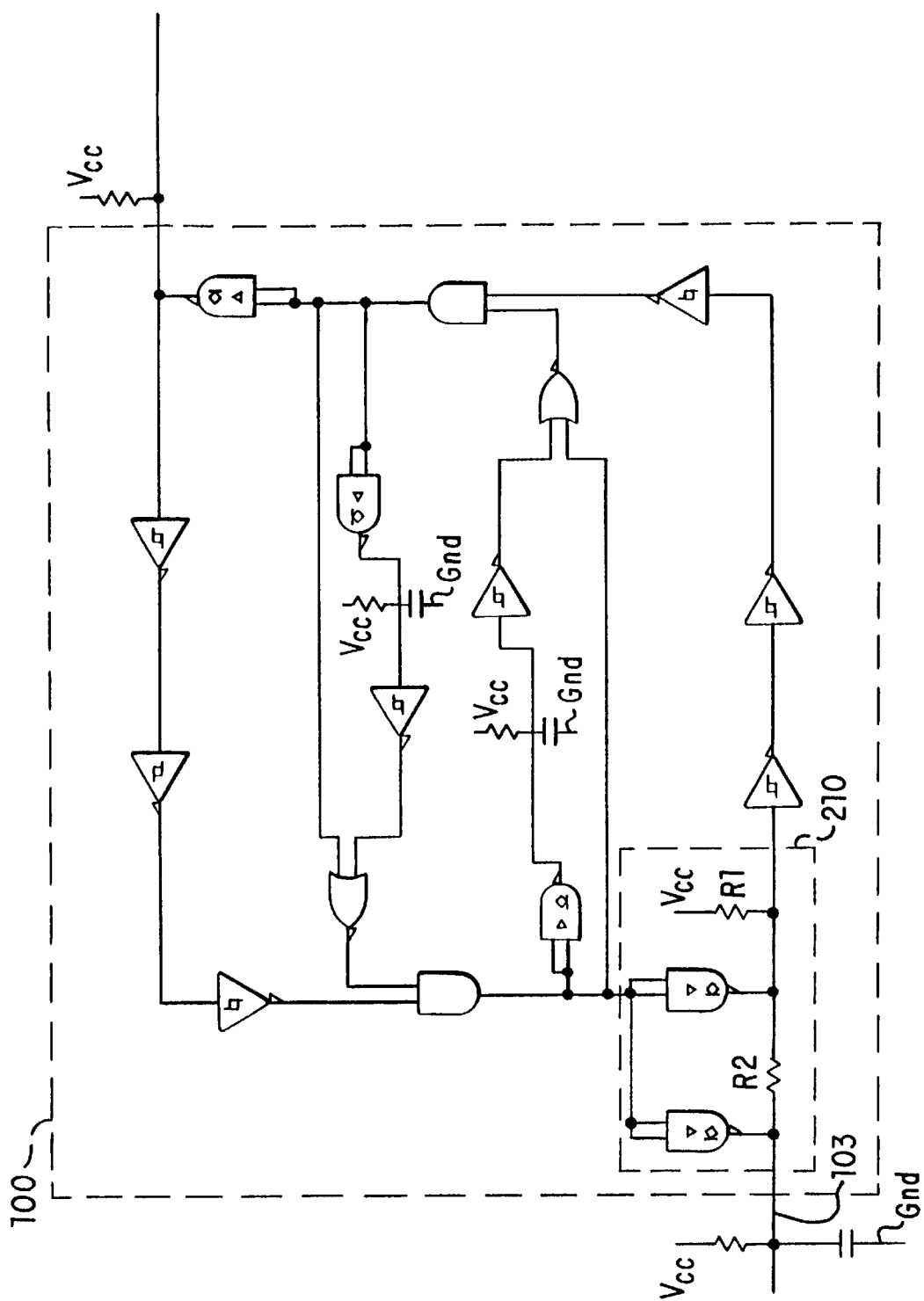
FIG. 6 is a circuit diagram of an alternative embodiment of the invention.

FIG. 6 is a circuit diagram showing an alternative embodiment of the invention. Though generally similar to the preferred embodiment, in the alternative embodiment the functional block of the first open collector driver 210 is implemented in circuitry as as a first pull up resistor R1 coupled with a second resistor R2 and a pair of 74F38 NAND gates as shown in FIG. 6, so as to provide drive capability for capacitive loads coupled with the port 103 of the buffer, for example a capacitance having a value greater than approximately twenty picofarads. For Transistor-Transistor-Logic (TTL), a ratio of resistance of the first pull up resistor R1 to resistance of the second resistor R2 (R1/R2) should be greater than or equal to approximately five to one. Preferably, resistance of the first pull up resistor R1 is approximately twelve point one KiloOhms, and resistance of the second resistor R2 is approximately one KiloOhm.

As described, the invention provides a bidirectional asynchronous open collector buffer. Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefor, the invention may be practiced otherwise than as specifically described and illustrated.

What is claimed is:

1. An apparatus comprising:
   a bidirectional asynchronous open collector buffer having a pair of signal ports, said buffer comprising a first open collector driver having an input coupled with a first one of the signal ports and having an output coupled with a second one of the signal ports for driving the second one of the ports to a low signal when said low signal is applied to the first one of the ports, and a second open collector driver having an input coupled with the second one of the signal ports and having an output coupled with the first one of the signal ports for driving the first one of the signal ports to said low signal when said low signal is applied to the second one of the ports; and
   a conductor having a length greater than approximately two inches long coupled with a member of the pair of signal ports of the buffer for transmitting a low signal there through.

2. An apparatus comprising:
   a bidirectional asynchronous open collector buffer having a pair of signal ports, including:
   a first open collector driver having an input coupled with a first one of the ports and having an output coupled with a second one of the ports for driving the second one of the ports to a low signal when said low signal is applied to the first one of the ports; and
   a second open collector driver having an input coupled with the second one of the ports and having an output coupled with the first one of the ports for driving the first one of the ports to said low signal when said low signal is applied to the second one of the ports.

3. An apparatus as in claim 2 wherein the buffer further includes:
   a first set delay element coupled with the output of the first open collector driver; and
   a first logic controller having an output coupled to the input of the second open collector driver and further having inputs coupled with the input of the first open collector driver and with the first set delay element for preventing latch up of the buffer when the low signal is applied to the first one of the ports of the buffer.

4. An apparatus as in claim 3 wherein:
   the buffer further includes a first reset delay element coupled with the input of the first open collector driver; and
   the first logic controller has another input coupled with the first reset delay element for suppressing oscillation of the buffer when the first one of the ports of the buffer is released from the applied low signal.

5. An apparatus as in claim 2 wherein the buffer further includes:
   a second set delay element coupled with the output of the second open collector driver; and
   a second logic controller having an output coupled to the input of the first open collector driver and further having inputs coupled with the input of the second open collector driver and with the second set delay element for preventing latch up of the buffer when the low signal is applied to the second one of the ports of the buffer.

6. An apparatus as in claim 5 wherein:
   the buffer further includes a second reset delay element coupled with the input of the second open collector driver; and
   the second logic controller has another input coupled with the second delay element for suppressing oscillation of the buffer when the second one of the ports of the buffer is released from the applied low signal.

7. An apparatus comprising:
   a bidirectional asynchronous open collector buffer having a pair of signal ports, said buffer comprising a first open collector driver having an input coupled with a first one of the signal ports and having an output coupled with a second one of the signal ports for driving the second one of the ports to a low signal when said low signal is applied to the first one of the ports, and a second open collector driver having an input coupled with the second one of the signal ports and having an output coupled with the first one of the signal ports for driving the first one of the signal ports to said low signal when said low signal is applied to the second one of the ports; and
   a capacitance having a length greater than approximately twenty picofarads coupled with a member of the pair of signal ports of the buffer for transmitting a low signal there through.

* * * * *